United States Patent
Ramesh et al.

(10) Patent No.: US 12,159,219 B2
(45) Date of Patent: Dec. 3, 2024

(54) NEURON USING POSITS

(71) Applicant: Micron Technology, Inc., Boise, ID (US)

(72) Inventors: Vijay S. Ramesh, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1046 days.

(21) Appl. No.: 16/997,599

(22) Filed: Aug. 19, 2020

(65) Prior Publication Data

US 2022/0058471 A1   Feb. 24, 2022

(51) Int. Cl.

| | |
|---|---|
| G06N 3/063 | (2023.01) |
| G06F 7/544 | (2006.01) |
| G06F 7/57 | (2006.01) |
| G06F 9/30 | (2018.01) |
| G06F 9/50 | (2006.01) |
| G06N 3/045 | (2023.01) |
| G06N 3/049 | (2023.01) |
| G06N 3/065 | (2023.01) |
| G06N 3/08 | (2023.01) |
| G11C 11/34 | (2006.01) |
| G11C 11/54 | (2006.01) |

(52) U.S. Cl.
CPC ........... *G06N 3/065* (2023.01); *G06F 7/5443* (2013.01); *G06F 7/57* (2013.01); *G06F 9/30098* (2013.01); *G06F 9/5027* (2013.01); *G06N 3/08* (2013.01); *G11C 11/34* (2013.01)

(58) Field of Classification Search
CPC .......... G06N 3/065; G06N 3/08; G06N 3/048; G06F 7/5443; G06F 7/57; G06F 9/30098; G06F 9/5027; G06F 2207/3812; G06F 7/483; G11C 11/34; G11C 11/56
See application file for complete search history.

(56) References Cited

U.S. PATENT DOCUMENTS

| | | | |
|---|---|---|---|
| 5,572,207 A | 11/1996 | Harding et al. | |
| 10,360,971 B1* | 7/2019 | Hokenmaier | G06N 3/063 |
| 2016/0350643 A1* | 12/2016 | Hosokawa | G06N 3/088 |

(Continued)

FOREIGN PATENT DOCUMENTS

| | | |
|---|---|---|
| KR | 20170015477 | 2/2017 |
| KR | 20190106185 | 9/2019 |
| WO | 2015187902 | 12/2015 |

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.

Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.

(Continued)

*Primary Examiner* — Brandon S Cole
(74) *Attorney, Agent, or Firm* — Brooks, Cameron & Huebsch, PLLC

(57) ABSTRACT

Systems, apparatuses, and methods related to a neuron using posits are described. An example apparatus may include a memory array including a plurality of memory cells configured to store data. The data can include a plurality of bit strings. The example apparatus may include a neuron component coupled to the memory array. The neuron component can include neuron circuitry configured to perform neuromorphic operations on at least one of the plurality of bit strings.

9 Claims, 8 Drawing Sheets

(56) References Cited

U.S. PATENT DOCUMENTS

| | | | |
|---|---|---|---|
| 2017/0011290 A1 | 11/2017 | Taha et al. | |
| 2018/0121130 A1* | 5/2018 | Li | G11C 11/4091 |
| 2018/0122456 A1* | 5/2018 | Li | G11C 7/1006 |
| 2018/0253639 A1* | 9/2018 | Snelgrove | G06N 3/063 |
| 2018/0315473 A1* | 11/2018 | Yu | G06N 3/04 |
| 2019/0005376 A1 | 1/2019 | Akin et al. | |
| 2019/0034782 A1 | 1/2019 | Davies et al. | |
| 2019/0042160 A1* | 2/2019 | Kumar | G06F 3/0659 |
| 2019/0088339 A1 | 3/2019 | Miyashita et al. | |
| 2019/0131977 A1* | 5/2019 | Obradovic | H03K 19/215 |
| 2019/0164600 A1 | 5/2019 | Castro | |
| 2019/0198093 A1* | 6/2019 | Khellah | G11C 7/12 |
| 2019/0198105 A1 | 6/2019 | Pirovano | |
| 2019/0279079 A1 | 9/2019 | Sim et al. | |
| 2020/0005126 A1 | 1/2020 | Kim et al. | |
| 2020/0394046 A1* | 12/2020 | Snelgrove | G06F 13/287 |

OTHER PUBLICATIONS

U.S. Appl. No. 16/001,790, entitled "Weight Storage Using Memory Device", filed Jun. 6, 2018, 58 pages.

Gustafson, et al., "Beating Floating Point at its Own Game: Posit Arithmetic", Research Paper, 16 pages.

Cococcioni, et al., Exploiting Posit Arithmetic for Deep Neural Networks in Autonomous Driving Applications:, Conference Paper, May 2018, 7 pages.

International Search Report and Written Opinion from related PCT Application No. PCT/US2021/039326, dated Oct. 21, 2021, 11 pages.

Chuhan, et al., "NeuralHMC: An Efficient HMC-Based Accelerator for Deep Neural Networks", 2019 24th Asia and South Pacific Design Automation Conference (ASP-DAC), ACM, Jan. 21, 2019 (Jan. 21, 2019), 6 pages.

* cited by examiner

NEURON USING POSITS

TECHNICAL FIELD

The present disclosure relates generally to semiconductor memory and methods, and more particularly, to apparatuses, systems, and methods for a neuron using posits.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
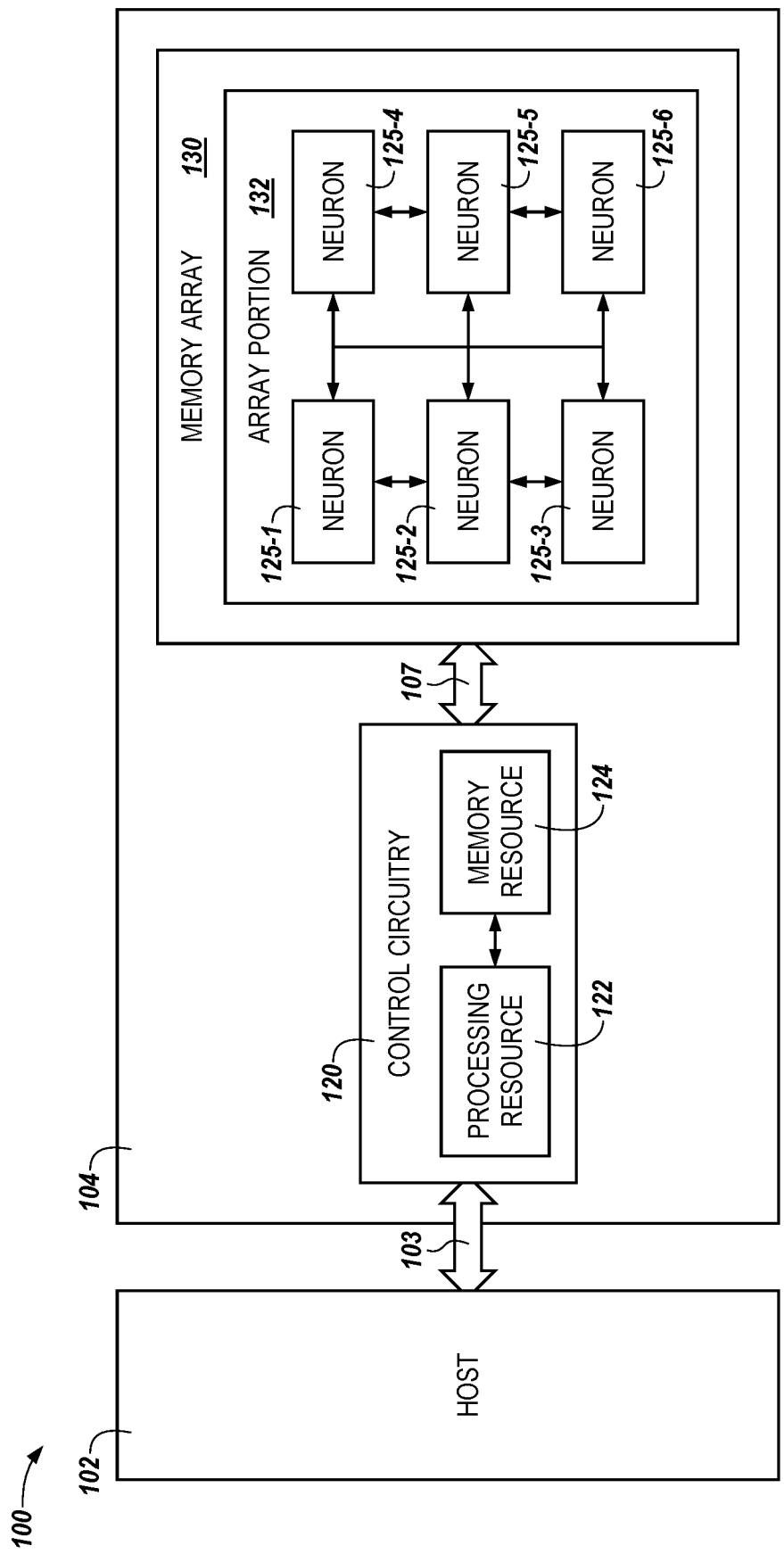
FIG. 1 is a functional block diagram in the form of a computing system including an apparatus including a host and a memory device in accordance with a number of embodiments of the present disclosure.

Systems, apparatuses, and methods related to a neuron using posits are described. An example apparatus may include a memory array including a plurality of memory cells configured to store data. The data can include a plurality of bit strings. The example apparatus may include a neuron component coupled to the memory array. The neuron component can be configured to perform neuromorphic operations on at least one of the plurality of bit strings.

The memory array can be within a memory device. The memory device may include control circuitry. The control circuitry may include a memory resource and a processing resource. The control circuitry may be coupled to a memory array. The memory array can include a plurality of neurons (e.g., neuron components). The memory array can store data including a plurality of bit strings. The control circuitry can control performance of neuromorphic operations on at least one of the plurality of bit strings. In this way, the neuromorphic memory array can act as a neural network. Analog weights can be input into operation of the neural network in order to train the neural network. In response to the data stored in the neural network having neuromorphic operations performed on the data including posits, the data can simulate learning and can be tested or analyzed to determine a degree of learning that has occurred. The data can be in a format including a universal number (unum) format, such as a Type III unum or posit format.

A neural network can include a set of instructions that can be executed to recognize patterns in data. Some neural networks can be used to recognize underlying relationships in a set of data in a manner that mimics the way that a human brain operates. A neural network can adapt to varying or changing inputs such that the neural network can generate a best possible result in the absence of redesigning the output criteria.

A neural network can consist of multiple neurons, which can be represented by one or more equations. In the context of neural networks, a neuron can receive a quantity of numbers or vectors as inputs and, based on properties of the neural network, produce an output. For example, a neuron can receive $X_k$ inputs, with k corresponding to an index of input. For each input, the neuron can assign a weight vector, $W_k$, to the input. The weight vectors can, in some embodiments, make the neurons in a neural network distinct from one or more different neurons in the network. In some neural networks, respective input vectors can be multiplied by respective weight vectors to yield a value, as shown by Equation 1, which shows and example of a linear combination of the input vectors and the weight vectors.

$$f(x_1, x_2) = w_1 x_1 + w_2 x_2 \qquad \text{Equation 1}$$

In some neural networks, a non-linear function (e.g., an activation function) can be applied to the value $f(x_1, x_2)$ that results from Equation 1. An example of a non-linear function that can be applied to the value that results from Equation 1 is a rectified linear unit function (ReLU). Application of the ReLU function, which is shown by Equation 2, yields the value input to the function if the value is greater than zero, or zero if the value input to the function is less than zero. The ReLU function is used here merely used as an illustrative example of an activation function and is not intended to be limiting. Other non-limiting examples of activation functions that can be applied in the context of neural networks can include sigmoid functions, binary step functions, linear activation functions, hyperbolic functions, leaky ReLU functions, parametric ReLU functions, softmax functions, and/or swish functions, among others.

$$\text{ReLU}(x) = \max(x, 0) \qquad \text{Equation 2}$$

During a process of training a neural network, the input vectors and/or the weight vectors can be altered to "tune" the network. In one example, a neural network can be initialized with random weights (e.g., such as analog weights). Over time, the weights can be adjusted to improve the accuracy of the neural network. This can, over time yield a neural network with high accuracy.

Neural networks have a wide range of applications. For example, neural networks can be used for system identification and control (vehicle control, trajectory prediction, process control, natural resource management), quantum chemistry, general game playing, pattern recognition (radar systems, face identification, signal classification, 3D reconstruction, object recognition and more), sequence recognition (gesture, speech, handwritten and printed text recognition), medical diagnosis, finance (e.g. automated trading systems), data mining, visualization, machine translation, social network filtering and/or e-mail spam filtering, among others.

Due to the computing resources that some neural networks demand, in some approaches, neural networks are deployed in a computing system, such as a host computing system (e.g., a desktop computer, a supercomputer, etc.) or a cloud computing environment. In such approaches, data to be subjected to the neural network as part of an operation to train the neural network can be stored in a memory resource, such as a NAND storage device, and a processing resource, such as a central processing unit, can access the data and execute instructions to process the data using the neural network. Some approaches may also utilize specialized hardware such a field-programmable gate array or an application-specific integrated circuit as part of neural network training. In other approaches, storage and training of one or more neural networks can occur within a non-volatile memory device, such as a dynamic random-access memory (DRAM) device.

Data that may be used for performing neural network (or neuromorphic) operations can be stored in particular formats. For example, data can be stored in an analog or digital format in order to increase accuracy of the data. One such format can include a format referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the fraction to indicate whether a real number is an exact float, or if it lies in the interval between adjacent floats. The sign, exponent, and fraction bits in a Type I unum take their definition from the IEEE 754 floating-point format, however, the length of the exponent and fraction fields of Type I unums can vary dramatically, from a single bit to a maximum user-definable length. By taking the sign, exponent, and fraction bits from the IEEE 754 standard floating-point format, Type I unums can behave similar to floating-point numbers, however, the variable bit length exhibited in the exponent and fraction bits of the Type I unum can require additional management in comparison to floats.

Referring to the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., $+\infty$ and $-\infty$) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

Referring back to the universal number format, Type II unums are generally incompatible with floats, which permits a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. For example, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for a broader dynamic range and a higher accuracy (e.g., precision) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations, thereby reducing processing time and/or power consumed in performing such operations. In addition, the use of posits in computing systems can allow for higher accuracy and/or precision than floating-point numbers, which can further improve the functioning of a computing system in comparison to some approaches (e.g., approaches which rely upon floating-point format bit strings). However, performing neural network or neuromorphic operations on data stored in the Type III unum format can be more difficult than performing such operations on data stored in an analog format.

Embodiments herein are directed to hardware circuitry (e.g., control circuitry, a digital to analog converter, an analog to digital converter, etc.) configured to perform various operations on bit strings to improve the overall functioning of a computing device. For example, embodiments herein are directed to hardware circuitry that is configured to perform neuromorphic operations in order to train a neural network or allow a neural network to simulate learning using posits.

In some embodiments, by performing the operations in such a manner, the hardware circuitry can facilitate improved performance of the neuromorphic operations for such neural network purposes while still maintaining improved accuracy and/or precision in the performance of operations performed external to the memory device and/or the neuromorphic memory array on the data in the unum or posit format, improved speed in performing the unum or posit operations, and/or a reduced required storage space for bit strings prior to, during, or subsequent to, performance of arithmetic and/or logical operations.

As used herein, the term "resident on" refers to something that is physically located on a particular component. For example, neuron circuitry, such as the neuron circuitry 552 illustrated in FIG. 5B being resident on the array portion 132 of the memory array 130 illustrated in FIG. 1 refers to a condition in which the physical hardware (e.g., the circuitry, logic, or other hardware components) that form the neuron circuitry are physically contained within the array portion and/or the memory array (i.e., within a same die or package) described below. The term "resident on" may be used interchangeably with other terms such as "deployed on" or "located on," herein.

By performing neuromorphic operations using neurons within a memory array (e.g., a DRAM memory array) and/or perform arithmetic operations using hardware circuitry, such operations can allow for neural network training and/or learning using data in the posit format in an improved way to increase efficiency of the neural network processing of the data in comparison to approaches in which such operations are performed external to the memory array or without use of data in the posit format. For example, performing neuromorphic operations on devices external to the memory array or on data that does not take advantage of the posit format can decrease efficiency of neuromorphic operations and decrease performance of the memory array and/or memory device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2A. A group or plurality of similar elements or components may generally be referred to herein with a single element number. For example, a plurality of reference elements 431-1, 431-2, 431-3 may be referred to generally as 431. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In addition, each of the components (e.g., the host 102, the control circuitry 120, the processing resource (or logic circuitry) 122, the memory resource 124, and/or the neuromorphic memory array 130) can be separately referred to herein as an "apparatus."

The memory device 104 can include one or more memory modules (e.g., single in-line memory modules, dual in-line memory modules, etc.). The memory device 104 can include volatile memory and/or non-volatile memory. In a number of embodiments, the memory device 104 can include a multi-chip device. A multi-chip device can include a number of different memory types and/or memory modules. For example, the memory device 104 can include non-volatile or volatile memory on any type of a module.

The memory device 104 can provide main memory for the computing system 100 or can be used as additional memory or storage throughout the computing system 100. The memory device 104 can include one or more neuromorphic memory arrays 130 (e.g., arrays of memory cells), which can include volatile and/or non-volatile memory cells. The neuromorphic memory array 130 can be a flash array with a NAND architecture, for example. Embodiments are not limited to a particular type of memory device, however, and the memory device 104 can include RAM, ROM, DRAM, SDRAM, PCRAM, RRAM, and/or flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, a host 102 can be coupled to the memory device 104. In a number of embodiments, the host 102 can be coupled to the memory device 104 via one or more channels 103 (e.g., buses, interfaces, communication paths, etc.). In addition, the control circuitry 120 of the memory device 104 can be coupled to the neuromorphic memory array 130 via a channel 107. The channel(s) 103 can be used to transfer data between the memory system 104 and a host 102 and can be in the form of a standardized interface. For example, when the memory system 104 is used for data storage in a computing system 100, the channel(s) 103 can be a serial advanced technology attachment (SATA), peripheral component interconnect express (PCIe), or a universal serial bus (USB), a double data rate (DDR) interface, among other connectors and interfaces. In general, however, channel(s) 103 can provide an interface for passing control, address, data, and other signals between the memory system 104 and a host 102 having compatible receptors for the channel(s) 103.

The host 102 can be a host system such as a personal laptop computer, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices, e.g., a number of processing devices (e.g., one or more processors, microprocessors, or some other type of controlling circuitry). One of ordinary skill in the art will appreciate that "a processor" can intend one or more processors, such as a parallel processing system, a number of coprocessors, etc.

The system 100 can include separate integrated circuits or both the host 102, the memory device 104, and the neuromorphic memory array 130 can be on the same integrated circuit. The system 100 can be, for instance, a server system and/or a high-performance computing (HIPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In some embodiments, the host 102 can be responsible for executing an operating system for a computing system 100 that includes the memory device 104. Accordingly, in some embodiments, the host 102 can be responsible for controlling operation of the memory device 104. For example, the host 102 can execute instructions (e.g., in the form of an operating system) that manage the hardware of the computing system 100 such as scheduling tasks, executing applications, controlling peripherals, etc.

Figure 2A:
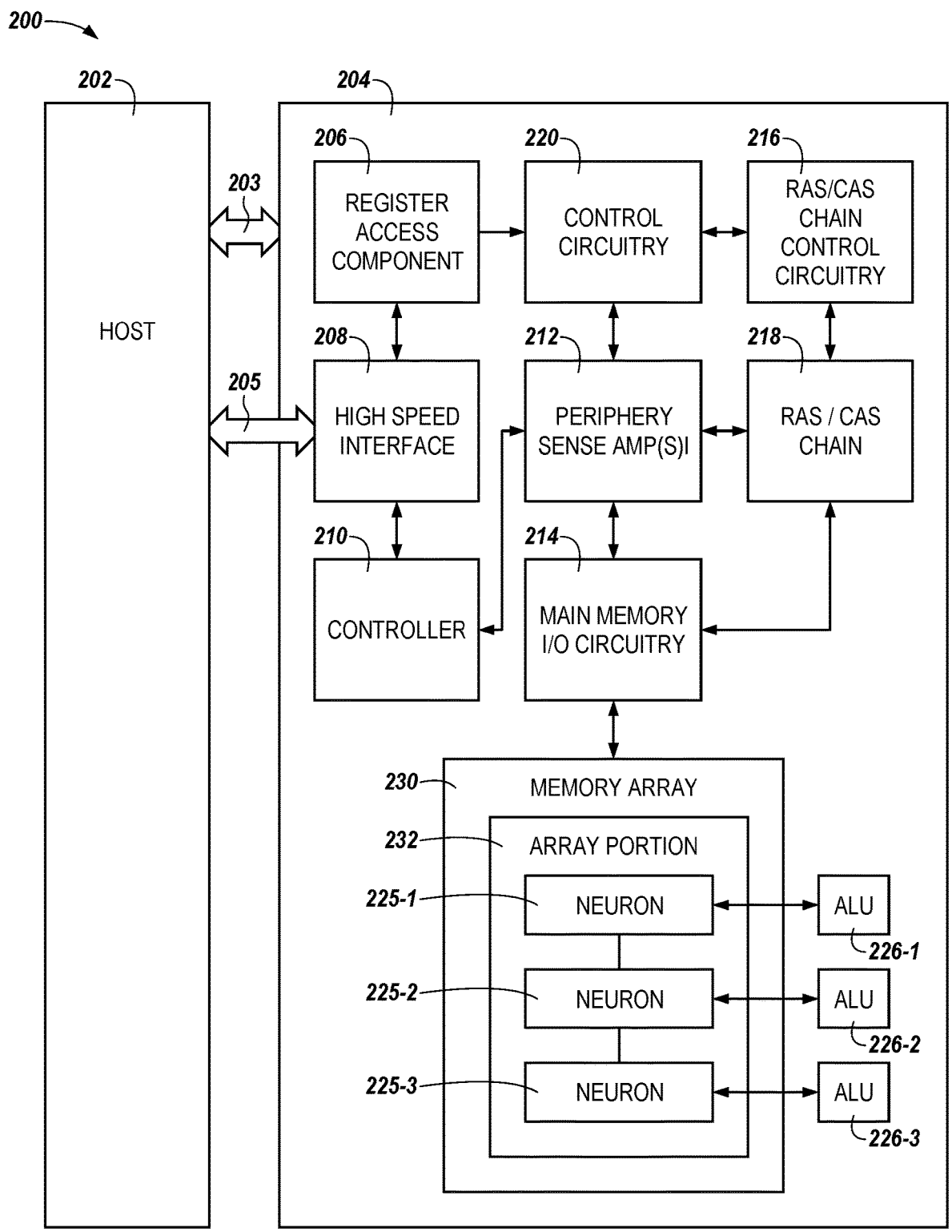
FIG. 2A is another functional block diagram in the form of a computing system including an apparatus including a host and a memory device in accordance with a number of embodiments of the present disclosure.
Figure 2B:
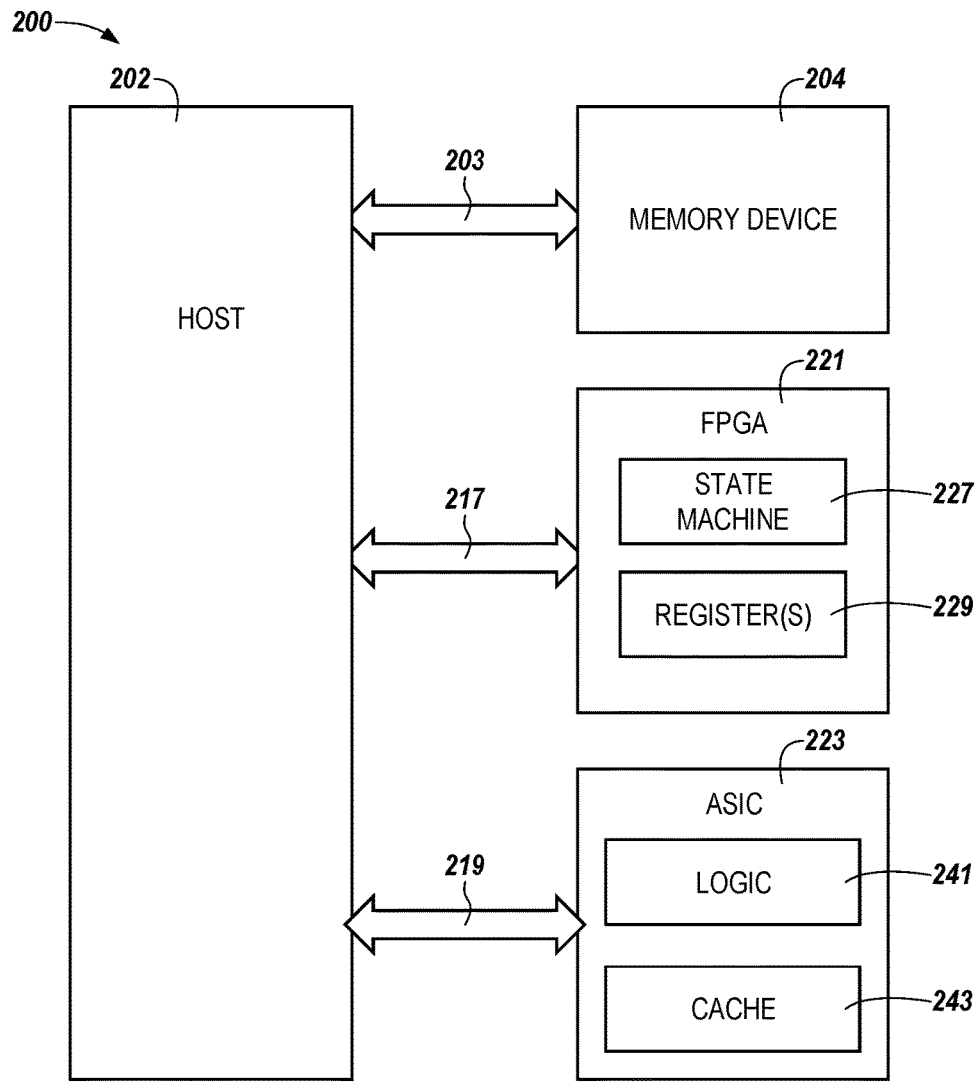
FIG. 2B is a functional block diagram in the form of a computing system including a host, a memory device, an application-specific integrated circuit, and a field programmable gate array in accordance with a number of embodiments of the present disclosure.

The memory device 104, which is shown in more detail in FIGS. 2A and 2B, herein, can include control circuitry 120, which can include a processing resource 122 and a memory resource 124. The processing resource 122 can be provided in the form of an integrated circuit, such as an application-specific integrated circuit (ASIC), field programmable gate array (FPGA), system-on-a-chip, or other combination of hardware and/or circuitry that is configured to perform arithmetic and/or logical operations on bit string received from the host 102 and/or other external devices, as described in more detail, herein. In some embodiments, the processing resource 122 can include an arithmetic logic unit (ALU). The ALU can include circuitry (e.g., hardware, logic, one or more processing devices, etc.) to perform operations (e.g., arithmetic operations, logical operations, bitwise operations, etc.) such as the operations described above, on integer binary bit strings, such as bit strings in the posit format. Embodiments are not limited to an ALU, however, and in some embodiments, the processing resource 122 can include a state machine and/or an instruction set architecture (or combinations thereof) in addition to, or in lieu of the ALU, as described in more detail in connection with FIG. 5, herein.

For example, the processing resource 122 can be configured to receive one or more bit strings (e.g., a plurality of bits) in a posit format and/or cause performance of operations such as arithmetic and/or logical operations using the bit strings in the posit format. In contrast to bit strings in the floating-point format, which include three integers or sets of bits—a set of bits referred to as a "base," a set of bits referred to as an "exponent," and a set of bits referred to as a "mantissa" (or significand), the bit string(s) in the posit format include four sets of bits—at least one bit referred to as a "sign," a set of bits referred to as a "regime," a set of bits referred to as an "exponent," and a set of bits referred to as a "mantissa" (or significand). As used herein, a set of bits is intended to refer to a subset of bits included in a bit string. Examples of the sign, regime, exponent, and mantissa sets of bits are described in more detail in connection with FIGS. 3 and 4A-4B, herein.

In some embodiments, the processing resource 122 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the processing resource 122 may be configured to perform (or cause performance of) other arithmetic and/or logical operations.

After the control circuitry 120 has performed an arithmetic and/or logical operation on the bit string(s), the control circuitry 120 can cause a resultant (e.g., a resultant bit string representing a result of the arithmetic operation and/or the logical operation) bit string to be transferred to the host 102, and/or the neuromorphic memory array 130. In some embodiments, the resultant bit string can be sent to the neuromorphic memory array 130 and the data of the resultant bit string can be input to a neural network of the neuromorphic memory array 130. For example, the resultant bit string can be used as an input to a number of neuromorphic operations performed by a plurality of neurons (e.g., neuron components) 125-1, 125-2, 125-3, 125-4, 125-5, 125-6 (referred to hereinafter as neuron components 125). In some embodiments, the control circuitry 120 can transfer the resultant bit string(s) to the host 102, and/or the neuromorphic memory array 130, for example, in the post format. The neuron components 125 can be coupled to each other and to other elements within the neuromorphic memory array 130, as will be described further below in association with FIGS. 5A-5C.

The control circuitry 120 can further include a memory resource 124, which can be communicatively coupled to the processing resource 122. The memory resource 124 can include volatile memory resource, non-volatile memory resources, or a combination of volatile and non-volatile memory resources. In some embodiments, the memory resource 124 can be a random-access memory (RAM) such as static random-access memory (SRAM). Embodiments are not so limited, however, and the memory resource 124 can be a cache, one or more registers, NVRAM, ReRAM, FeRAM, MRAM, PCM), "emerging" memory devices such as 3-D Crosspoint (3D XP) memory devices, etc., or combinations thereof.

The control circuitry 120 can be communicatively coupled to the neuromorphic memory array 130 via one or more channels 107. The neuromorphic memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 104 a number of memory arrays 130 (e.g., a number of banks of DRAM cells, NAND flash cells, etc.). Further, the array 130 can include neurons 125 arranged in rows and columns and coupled to the memory cells, as will be described further below in association with FIG. 5C.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the neuromorphic memory array 130. It will be appreciated by those skilled in the art that the number of address input connections can depend on the density and architecture of the memory device 104 and/or the memory array 130.

FIG. 2A is another functional block diagram in the form of a computing system including an apparatus 200 including a host 202 and a memory device 204 in accordance with a number of embodiments of the present disclosure. The memory device 204 can include control circuitry 220, which can be analogous to the control circuitry 120 illustrated in FIG. 1. Similarly, the host 202 can be analogous to the host 102 illustrated in FIG. 1, the memory device 204 can be analogous to the memory device 104 illustrated in FIG. 1, and the neuromorphic memory array 230 can be analogous to the neuromorphic memory array 130 illustrated in FIG. 1. Each of the components (e.g., the host 202, the control circuitry 220, the processing resource 222, the memory resource 224, and/or the neuromorphic memory array 230, etc.) can be separately referred to herein as an "apparatus."

The host 202 can be communicatively coupled to the memory device 204 via one or more channels 203, 205. The channels 203, 205 can be interfaces, buses, communication paths, or other physical connections that allow for data and/or commands to be transferred between the host 202 and the memory device 204. The channels 203, 205 can be used to transfer data between the memory system 204 and a host 202 and can be in the form of a standardized interface.

When the memory system 204 is used for data storage in a computing system 200, the channels 203, 205 can be a serial advanced technology attachment (SATA), peripheral component interconnect express (PCIe), or a universal serial bus (USB), a double data rate (DDR) interface, among other connectors and interfaces. In general, however, channels 203, 205 can provide an interface for passing control, address, data, and other signals between the memory system 204 and a host 202 having compatible receptors for the channels 203, 205. In some embodiments, commands to cause initiation of an operation (e.g., an operation to perform arithmetic and/or logical operations on the bit string(s) in the posit format) to be performed by the control circuitry 220 can be transferred from the host via the channels 203, 205.

It is noted that, in some embodiments, the control circuitry 220 can perform the arithmetic and/or logical operations in response to an initiation command transferred from the host 202 via one or more of the channels 203, 205 in the absence of an intervening command from the host 202. That is, once the control circuitry 220 has received the command to initiate performance of an operation from the host 202, the operations can be performed by the control circuitry 220 in the absence of additional commands from the host 202. However, in some embodiments, the control circuitry 220 can perform the operations in response to receipt of a bit string (e.g., a bit string in the posit format) in the absence of a command (e.g., an initiation command) from the host 202 specifying that the operation is to be performed. For example, the control circuitry 220 can be configured to self-initiate performance of arithmetic and/or logical operations on the received bit string(s) in response to receiving the bit string(s). However, in some embodiments, in response to receiving a command to perform neuromorphic operations on the data, the data can be converted to an analog format while being sent to the neuromorphic memory array 230.

As used herein, a "first level of precision" and a "second level of precision" generally refer to the accuracy of a bit string and/or a resultant bit string that represent a result of an operation performed using one or more bit strings. For example, floating-point format bit strings can be described herein as having a "first level of precision," while unum bit strings (e.g., posit format bit strings) can be referred to as having a particular precision or "second level of precision," because, as described in more detail herein, unum bit strings can offer a higher level of precision under certain conditions than floating-point formatted numbers.

In some embodiments, the floating-point format or the unum format can refer to a digital format while an additional format can include an analog format. A digital format can use discrete values such as a "0" or a "1", while an analog format can use more continuous values and can represent physical measurements along that continuum.

As shown in FIG. 2A, the memory device 204 can include a register access component 206, a high speed interface (HSI) 208, a controller 210, one or more periphery sense amplifiers (PSAs) 212, main memory input/output (I/O) circuitry 214, row address strobe (RAS)/column address strobe (CAS) chain control circuitry 216, a RAS/CAS chain component 218, control circuitry 220, and a neuromorphic memory array 230. The control circuitry 220 is, as shown in FIG. 2A, located in an area of the memory device 204 that is physically distinct from the neuromorphic memory array 230. That is, in some embodiments, the control circuitry 220 is located in a periphery location of the neuromorphic memory array 230.

The register access component 206 can facilitate transferring and fetching of data from the host 202 to the memory device 204 and from the memory device 204 to the host 202. For example, the register access component 206 can store addresses (or facilitate lookup of addresses), such as memory addresses, that correspond to data that is to be transferred to the host 202 form the memory device 204 or transferred from the host 202 to the memory device 204. In some embodiments, the register access component 206 can facilitate transferring and fetching data that is to be operated upon by the control circuitry 220 and/or the register access component 206 can facilitate transferring and fetching data that is has been operated upon by the control circuitry 220 for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)), or other suitable interface for transferring commands and/or data between the host 202 and the memory device 204 via the channel(s) 203, 205.

The controller 210 can be responsible for executing instructions from the host 202 and accessing the control circuitry 220 and/or the neuromorphic memory array 230. The controller 210 can be a state machine, a sequencer, or some other type of controller. The controller 210 can receive commands from the host 202 (via the HSI 208, for example) and, based on the received commands, control operation of the control circuitry 220 and/or the neuromorphic memory array 230. In some embodiments, the controller 210 can receive a command from the host 202 to cause performance of an arithmetic and/or logical operation on received bit strings using the control circuitry 220. Responsive to receipt of such a command, the controller 210 can instruct the control circuitry 220 to begin performance of the arithmetic and/or logical operation(s).

In some embodiments, the controller 210 can be a global processing controller and may provide power management functions to the memory device 204. Power management functions can include control over power consumed by the memory device 204 and/or the neuromorphic memory array 230. For example, the controller 210 can control power provided to various banks of the neuromorphic memory array 230 to control which banks of the neuromorphic memory array 230 are operational at different times during operation of the memory device 204. This can include shutting certain banks of the neuromorphic memory array 230 down while providing power to other banks of the neuromorphic memory array 230 to optimize power consumption of the memory device 230. In some embodiments, the controller 210 controlling power consumption of the memory device 204 can include controlling power to various cores of the memory device 204 and/or to the control circuitry 220, the neuromorphic memory array 230, etc.

The PSAs 212 are intended to provide additional functionalities (e.g., peripheral amplifiers) that sense (e.g., read, store, cache) data values of memory cells in the neuromorphic memory array 230 and that are distinct from the neuromorphic memory array 230. The PSAs 212 can include latches and/or registers. For example, additional latches can be included in the PSAs 212. The latches of the PSAs 212 can be located on a periphery of the neuromorphic memory array 230 (e.g., on a periphery of one or more banks of memory cells) of the memory device 204.

The main memory input/output (I/O) circuitry 214 can facilitate transfer of data and/or commands to and from the neuromorphic memory array 230. For example, the main memory I/O circuitry 214 can facilitate transfer of bit strings, data, and/or commands from the host 202 and/or the control circuitry 220 to and from the neuromorphic memory array 230. In some embodiments, the main memory I/O circuitry 214 can include one or more direct memory access (DMA) components that can transfer the bit strings (e.g., posit bit strings stored as blocks of data) from the control circuitry 220 to the neuromorphic memory array 230, and vice versa.

In some embodiments, the main memory I/O circuitry 214 can facilitate transfer of bit strings, data, and/or commands from the neuromorphic memory array 230 to the control circuitry 220 so that the control circuitry 220 can perform arithmetic and/or logical operations on the bit strings. Similarly, the main memory I/O circuitry 214 can facilitate transfer of bit strings that have had one or more operations performed on them by the control circuitry 220 to the neuromorphic memory array 230. In this way, the data in the unum or posit format can be operated on by the control circuitry 220 to perform arithmetic and/or logical operations while the data is stored in an array or other location other than the neuromorphic memory array 230; and the data, while being stored in the neuromorphic memory array 230, can be used to perform neuromorphic operations. As described in more detail herein, the operations can include arithmetic operations performed on bit strings in a posit format, logical operations performed on bit strings in a posit format, bitwise operations performed on bit strings in a posit format, etc., and neuromorphic operations performed on bit strings in a posit format.

The row address strobe (RAS)/column address strobe (CAS) chain control circuitry 216 and the RAS/CAS chain component 218 can be used in conjunction with the neuromorphic memory array 230 to latch a row address and/or a column address to initiate a memory cycle. In some embodiments, the RAS/CAS chain control circuitry 216 and/or the RAS/CAS chain component 218 can resolve row and/or column addresses of the neuromorphic memory array 230 at which read and write operations associated with the neuromorphic memory array 230 are to be initiated or terminated. For example, upon completion of an operation using the control circuitry 220, the RAS/CAS chain control circuitry 216 and/or the RAS/CAS chain component 218 can latch and/or resolve a specific location in the neuromorphic memory array 230 to which the bit strings that have been operated upon by the control circuitry 220 to perform neuromorphic operations are to be stored. Similarly, the RAS/CAS chain control circuitry 216 and/or the RAS/CAS chain component 218 can latch and/or resolve a specific location in the neuromorphic memory array 230 from which bit strings are to be transferred to the control circuitry 220 prior to the control circuitry 220 performing a neuromorphic operation on the bit string(s) in an analog format.

As described above in connection with FIG. 1, the neuromorphic memory array 230 can be a DRAM array, SRAM array, STT RAM array, PCRAM array, TRAM array, RRAM array, NAND flash array, and/or NOR flash array, for instance, although embodiments are not limited to these particular examples. The neuromorphic memory array 230 can function as main memory for the computing system 200 shown in FIG. 2. In some embodiments, the neuromorphic memory array 230 can be configured to store bit strings operated on by the control circuitry 220 and/or store bit strings to be transferred to the control circuitry 220. The neuromorphic memory array 230 can include an array portion 232. The array portion 232 can include a plurality of neurons (e.g., neuron components) 225-1, 225-2, 225-3 (hereinafter referred to collectively as neurons 225) that are used to perform a number of neuromorphic operations, as will be described below. The neurons 225 can be coupled to a plurality of arithmetic logic units (ALUs) 226-1, 226-2, 226-3 (hereinafter referred to collectively as ALUs 226)

The control circuitry 220 can include logic circuitry (e.g., the processing resource 122 illustrated in FIG. 1) and/or memory resource(s) (e.g., the memory resource 124 illustrated in FIG. 1). As described above in connection with FIG. 1 and in more detail below in connection with FIG. 6, the control circuitry 220 can be configured to receive one or more bit strings in the posit format and cause performance of neuromorphic operations using the one or more bit strings in the posit format by the neuromorphic memory array 230.

For example, bit strings (e.g., data, a plurality of bits, etc.) can be received by the control circuitry 220 from, for example, the host 202 in a first format (e.g., posit format), and/or the neuromorphic memory array 230 in the first format (e.g., in the posit format), and stored by the control circuitry 220, for example in the memory resource (e.g., the memory resource 624 illustrated in FIG. 6, herein) of the control circuitry 220. The control circuitry 220 can perform arithmetic and/or logical operations (or cause arithmetic and/or logical operations to be performed on) the bit string (s), as described in more detail in connection with FIG. 6, herein.

As described in more detail in connection with FIGS. 3 and 4A-4B, posits can provide improved accuracy (e.g., precision) and may require less storage space (e.g., may contain a smaller number of bits) than corresponding bit strings represented in the floating-point format. Accordingly, by using the posit bit strings to perform neuromorphic operations using neurons of a neural network using the control circuitry 220, performance of the computing system 200 may be improved in comparison to approaches that utilize posit bit strings for performance of neuromorphic operations external to the memory array, because neuromorphic operations may be performed more quickly internal to the memory array (e.g., because the neuromorphic operations lend themselves more efficient when within the memory array).

As described above, once the control circuitry 220 has received the posit bit strings from the host 202, and/or the neuromorphic memory array 230, the control circuitry 220 can perform (or cause performance of) arithmetic and/or logical operations on the received posit bit strings. For example, the control circuitry 220 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. on the received posit bit strings. As will be appreciated, the foregoing list of operations is not intended to be exhaustive, nor is the foregoing list of operations intended to be limiting, and the control circuitry 220 may be configured to perform (or cause performance of) other arithmetic and/or logical operations on posit bit strings.

In some embodiments, the control circuitry 220 may perform the above-listed operations in conjunction with execution of one or more machine learning algorithms. For example, the control circuitry 220 may perform operations related to one or more neural networks such as is used in the neuromorphic memory array 230. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed) when transferring data in and out of a memory array in order to be processed by external devices. In contrast, by performing such operations using the neurons 225 to perform such neuromorphic operations on bit strings, the amount of processing resources and/or the amount of time consumed in performing the operations may be reduced in comparison to approaches in which such operations are performed using elements external to the memory array.

FIG. 2B is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2B, the host 202 can be coupled to the memory device 204 via channel(s) 203, which can be analogous to the channel(s) 103 illustrated in FIG. 1. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( ), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 and perform arithmetic and/or logical operations on the posit bit strings to produce resultant posit bit strings that represents a result of the operation performed on the received posit bit strings. Further, the FPGA 221 can be configured to cause performance of neuromorphic operations in the neuromorphic memory array 230 using neurons, as will be described further below in association with FIGS. 5A-5C.

The register(s) 229 of the FPGA 221 can be configured to buffer and/or store the posit bit strings received form the host 202 prior to the state machine 227 performing an operation on the received posit bit strings. In addition, the register(s) 229 of the FPGA 221 can be configured to buffer and/or store a resultant posit bit string that represents a result of the operation performed on the received posit bit strings prior to transferring the result to circuitry external to the ASIC 233, such as the host 202 or the memory device 204, etc.

The ASIC 223 can include logic 241 and/or a cache 243. The logic 241 can include circuitry configured to perform operations on an input and produce an output. In some embodiments, the ASIC 223 is configured to receive posit bit strings from the host 202 and perform arithmetic and/or logical operations on the posit bit strings to produce resultant posit bit strings that represents a result of the operation performed on the received posit bit strings. Likewise, the ASIC 223 can facilitate the performance of subsequent neuromorphic operations to be performed on the bit strings.

The cache 243 of the ASIC 223 can be configured to buffer and/or store the posit bit strings received form the host 202 prior to the logic 241 performing an operation on the received posit bit strings. In addition, the cache 243 of the ASIC 223 can be configured to buffer and/or store a resultant posit bit string that represents a result of the operation performed on the received posit bit strings prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 241, and/or a cache, such as the cache 243 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 241 and/or the cache 243.

Figure 3:
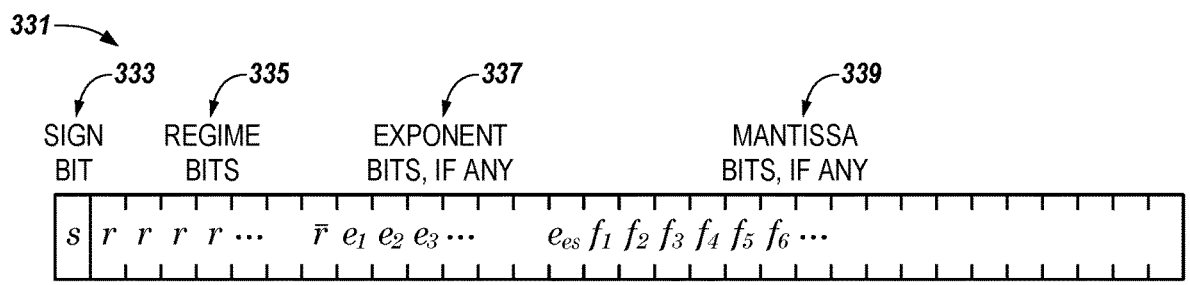
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a sign bit 333), a set of regime bits (e.g., the regime bits 335), a set of exponent bits (e.g., the exponent bits 337), and a set of mantissa bits (e.g., the mantissa bits 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 $\bar{r}$ correspond to an opposite bit that terminates the bit string. For example, for the numerical k value −2 shown in Table 1, the regime bits r correspond to the first two leading zeros, while the regime bit(s) $\bar{r}$ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed=2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f which can be analogous to the fraction 1f where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0f).

Figure 4A:
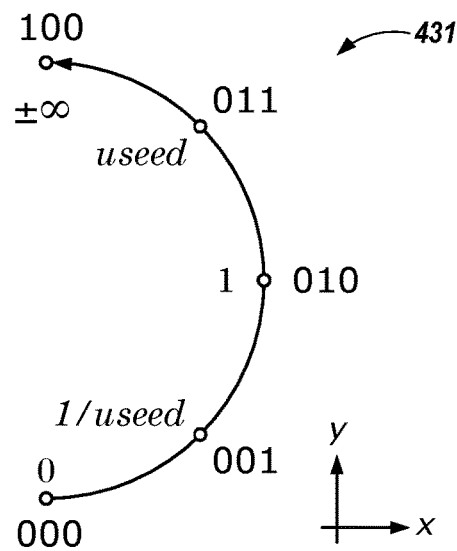
FIG. 4A is an example of positive values for a 3-bit posit.

FIG. 4A is an example of positive values for a 3-bit posit 431. In FIG. 4A, only the right half of projective real numbers, however, it will be appreciated that negative projective real numbers that correspond to their positive counterparts shown in FIG. 4A can exist on a curve representing a transformation about the y-axis of the curves shown in FIG. 4A.

In the example of FIG. 4A, es=2, so useed=$2^{2^{es}}$=16. The precision of a posit 431 can be increased by appending bits the bit string, as shown in FIG. 4B. For example, appending a bit with a value of one (1) to bit strings of the posit 431-1 increases the accuracy of the posit 431 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

Figure 4B:
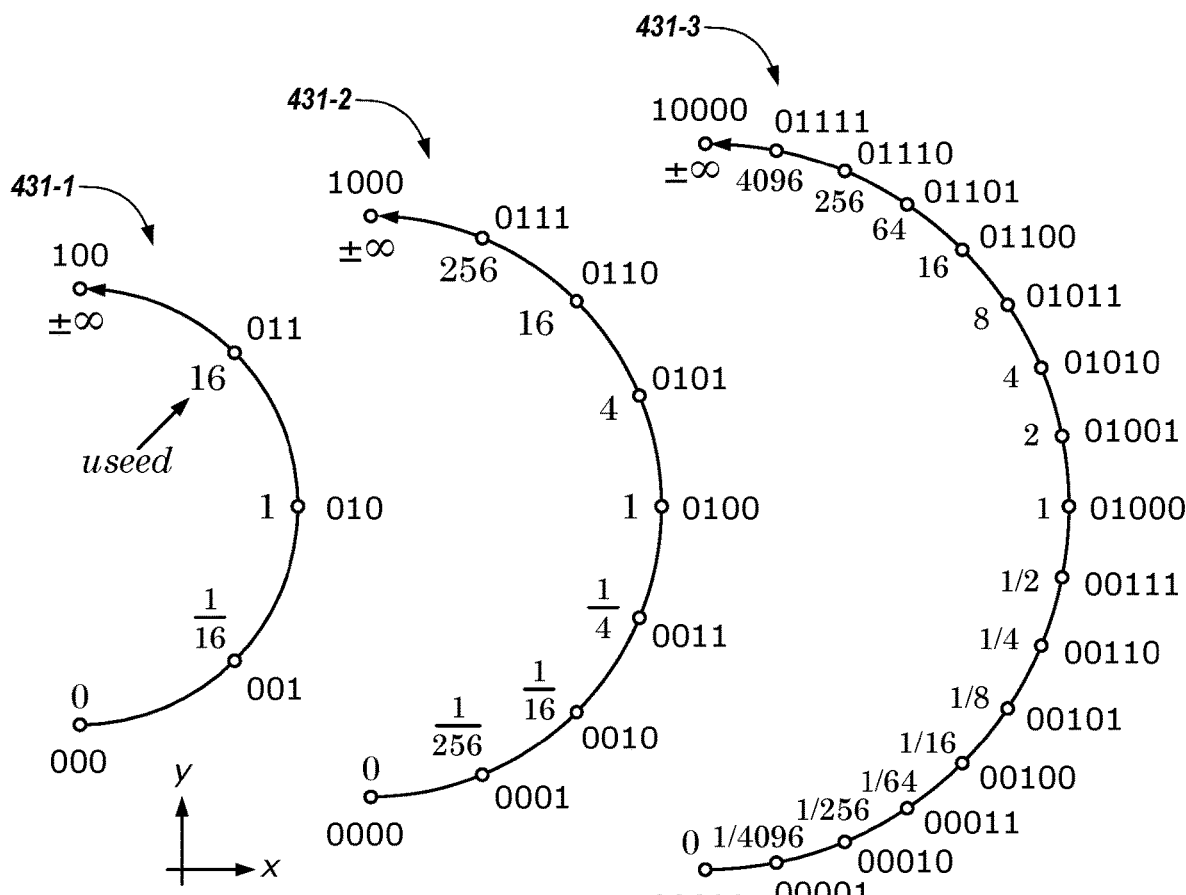
FIG. 4B is an example of posit construction using two exponent bits.

If maxpos is the largest positive value of a bit string of the posits 431-1, 431-2, 431-3 shown in FIG. 4B, and minpos is the smallest value of a bit string of the posits 431-1, 431-2, 431-3, maxpos may be equivalent to useed and minpos may be equivalent to $$\frac{1}{useed}.$$

Between maxpos and $\infty$, a new bit value may be maxpos*useed, and between zero and minpos, a new bit value may be $$\frac{minpos}{useed}.$$

These new bit values can correspond to a new regime bit 335. Between existing values $x=2^m$ and $y=2^n$, where m and n differ by more than one, the new bit value (m+n) may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about the y-axis of the curves shown in FIG. 4B. The posits 431-1, 431-2, 431-3 shown in FIG. 4B each include only two exception values: Zero (0) when all the bits of the bit string are zero and $\pm\infty$ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit ($\bar{r}$) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding to the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and f is a value represented by $1.f_1 f_2 \ldots f_{fs}$ (e.g., by a one followed by a decimal point followed by the mantissa bits 339), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases}$$

Equation 1

A further illustrative example of decoding a posit bit string is provided below in connection with the posit bit string 0000110111011101 shown in Table 3, below follows.

TABLE 3

| SIGN | REGIME | EXPONENT | MANTISSA |
|---|---|---|---|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., useed$^k$). The exponent bits 337 represent five (5) as an unsigned integer and therefore contribute an additional scale factor of $2^{2^{es}} = 2^5 = 32$. Lastly, the mantissa bits 339, which are given in Table 3 as 11011101, represent two-hundred and twenty-one (221) as an unsigned integer, so the mantissa bits 339, given above as f are f+221/256. Using these values and Equation 1, the numerical value corresponding to the posit bit string given in $$\text{Table 3 is} + 256^{-3} \times 2^5 \times \left(1 + \frac{221}{256}\right) = \frac{437}{134217728} \approx 3.55393 \times 10^{-6}.$$

Figure 5A:
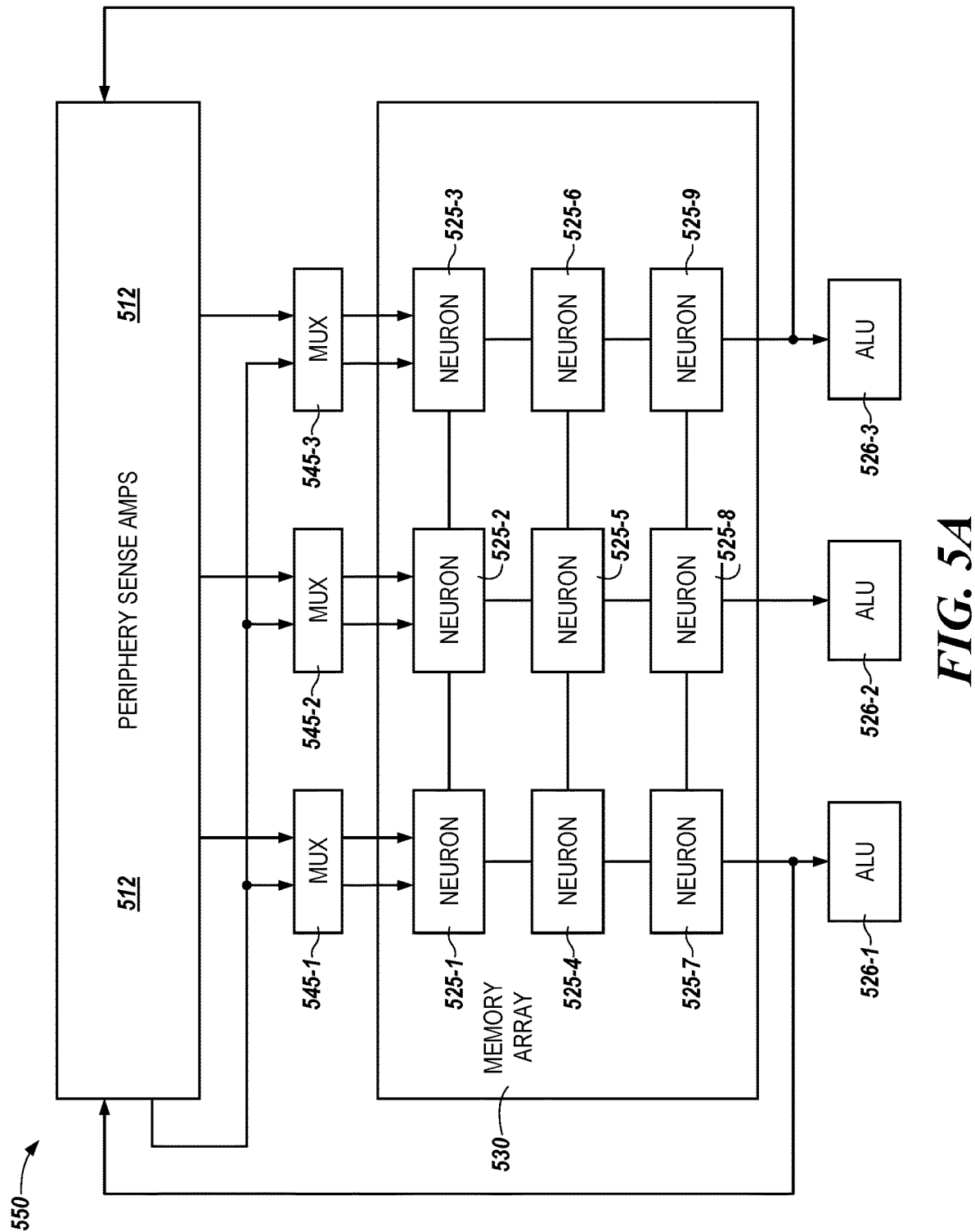
FIG. 5A is a functional block diagram in the form of periphery sense amps, a memory array, and a plurality of arithmetic logic units (ALUs) in accordance with a number of embodiments of the present disclosure.

FIG. 5A is a functional block diagram 550 in the form of periphery sense amps 512, a memory array 530, a plurality of muxes 545, and a plurality of arithmetic logic units (ALUs) 526 in accordance with a number of embodiments of the present disclosure. The neuromorphic memory array 530 can receive data from a host (e.g., host 102, 202 in FIGS. 1, 2A, 2B) or other external device. The data can include bit strings in a particular format (e.g., an unum number or posit format). The data in the posit format can be stored in periphery sense amps (PSAs) 512 and/or other locations within a memory device (such as memory device 104 in FIG. 1). The PSAs 512 can be coupled to a plurality of multiplexers ("MUX"es) 545-1, 545-2, 545-3, (hereinafter referred to collectively as MUXes 545) and the data in the posit format can be sent through the MUXes 545 to neuron components 525-1, 525-2, 525-3, 525-4, 525-5, 525-6, 525-7, 525-8 (referred to hereinafter collectively as neuron components 525). The neuron components 525 can perform a number of neuromorphic operations on the data. Further, the neuron components 525 can send the data and/or results of performing the neuromorphic operations on the data to additional devices. For example, the neuron components 525 can be coupled to a plurality of arithmetic logic units (ALUs) 526-1, 526-2, 526-3 (referred to hereinafter as ALUs 526). The neuron components 525 can send the data or results to the ALUs for performance of additional operations (e.g., RELU operations, sigma operations, etc.).

In one embodiment, neuromorphic operations can be performed using the neuron components 525 as a neural network. Some neuromorphic systems may use resistive RAM (RRAM) such as PCM devices or self-selecting memory devices to store a value (or weight) of a synapse (e.g., synaptic weight). Such variable resistance memory may include memory cells configured to store multiple levels and/or that may have wide sense windows. Such types of memory may be configured to perform training operations by pulse (e.g., spike) control. Such training operations may include spike-timing-dependent plasticity (STDP). STDP may be a form of Hebbian learning that is induced by correlation between spikes transmitted between nodes (e.g., neurons). STDP may be an example of a process that adjusts the strength of connections between nodes (e.g., neurons).

In neural networks, a synaptic weight refers to the strength or amplitude of a connection between two nodes (e.g., neurons). The nature and content of information transmitted through a neural network may be based in part on the properties of connections, which represent synapses, formed between the nodes. For example, the property of the connections can be synaptic weights. Neuromorphic systems and devices, among others, may be designed to achieve results that may not be possible with traditional computer architectures. For example, neuromorphic systems may be used to achieve results more commonly associated with biological systems such as learning, vision or visual processing, auditory processing, advanced computing, or other processes, or a combination thereof. As an example, the synaptic weight and/or connections between at least two memory cells can represent a synapse, or a strength or degree of connectivity of the synapse and be associated with a respective short-term connection or a long-term connection, which corresponds to the biological occurrence of short-term and long-term memory. A series of neural network operations can be performed in order to increase the synaptic weight between the at least two memory cells in a short-term or a long-term fashion, depending on which type of memory cell is used, as will be described below.

A learning event of a neural network operation can represent causal propagation of spikes among neurons, enabling a weight increase for the connecting synapses. A weight increase of a synapse can be represented by an increase in conductivity of a memory cell. A variable resistance memory array (for example a 3D cross-point or self-selecting memory (SSM) array) can mimic an array of synapses, each characterized by a weight, or a memory cell conductance. The greater the conductance, the greater the synaptic weight and the higher the degree of memory learning. Short-term memory learning can be a fast and/or reversible memory learning where the analog weight of a synapse is enhanced, namely, its electrical conduction is increased by a reversible mechanism. Long-term memory learning can be a slow and/or irreversible memory learning where the cell conductance is irreversibly increased for a particular state (e.g., SET or RESET), leading to unforgettable memory coming from a longer, experience-dependent learning.

Neuromorphic operations can be used to mimic neurobiological architectures that may be present in a nervous system and/or to store synaptic weights associated with long-term and short-term learning or relationships are described herein. A memory apparatus may include a memory array including a first portion and a second portion. The first portion of the memory array can include a first plurality of variable resistance memory cells and the second portion can include a second plurality of variable resistance memory cells. The second portion can be degraded through forced write cycling. The degradation mechanism can include damage to the chalcogenide material. In some embodiments that include memory cells comprised of material other than chalcogenide material, the degradation mechanism can include the thermal relationship between memory cells, control via control gate coupling between memory cells, a charge loss corresponding to the memory cells, a temperature induced loss of signal or threshold, etc.

These neuromorphic operations can be performed on data received by the neuromorphic memory array 530. In anticipation of the neural network being used to detect a particular event represented by the data or a pattern in the data, the neural network can receive a large amount of data (what may be referred to as analog weights 559 in FIG. 5B, described below) used to train the neural network (e.g., using the data sent to the neuron components 525). In one embodiment, as the data including bit strings is received, analog weights can be added to the data values in order to train the neural network for subsequent neuromorphic processing. The training can include a large volume of data that allows the neural network of the neuromorphic memory array 530 to correctly interpret the data and provide a desired or helpful result. Using the neural network processing described above, the large amount of data can train the neural network of the neuromorphic memory array 530 to detect the event or pattern and become more effective and efficient at doing so.

The resultant value of the neuromorphic operation can be sent outside the neuromorphic memory array 530 for further processing to the ALUs 526 and/or to other storage locations. In this way, multiple levels of processing can occur on the same portion of data. For example, a command can be sent from a host to perform both arithmetic/logical operations and neuromorphic operations on a set of data.

Depending on the order of processing, the arithmetic operations can be performed while the data is outside the neuromorphic memory array 530. The result of the arithmetic operation can be sent to the neuromorphic memory array 530 for performance of the neuromorphic operations. Subsequent to the neuromorphic operations being performed, the data can be sent from the neuron components 525 to other locations within the memory device. The result of the neuromorphic operation can be sent outside the neuron components 525 and subsequent arithmetic operations can be performed. The result of the neuromorphic operations and/or the arithmetic operations can be sent back to the host.

As used herein, neural network operation or neuromorphic operation can include operations that are performed to determine one or more hidden layers of at least one of the neural networks. In general, a neural network can include at least one input layer, at least one hidden layer, and at least one output layer. The layers can include multiple neurons that can each receive an input and generate a weighted output. In some embodiments, the neurons of the hidden layer(s) can calculate weighted sums and/or averages of inputs received from the input layer(s) and their respective weights and pass such information to the output layer(s).

In some embodiments, the neural network or neuromorphic operations can be performed by utilizing knowledge learned by the trained neural networks during their training to train the untrained neural networks. This can reduce the amount of time and resources spent in training untrained neural networks by reducing retraining of information that has already been learned by the trained neural networks. In addition, embodiments herein can allow for a neural network that has been trained under a particular training methodology to train an untrained neural network with a different training methodology. For example, a neural network can be trained under a Tensorflow methodology and can then train an untrained neural network under a MobileNet methodology (or vice versa). Embodiments are not limited to these specific examples, however, and other training methodologies are contemplated within the scope of the disclosure.

Figure 5B:
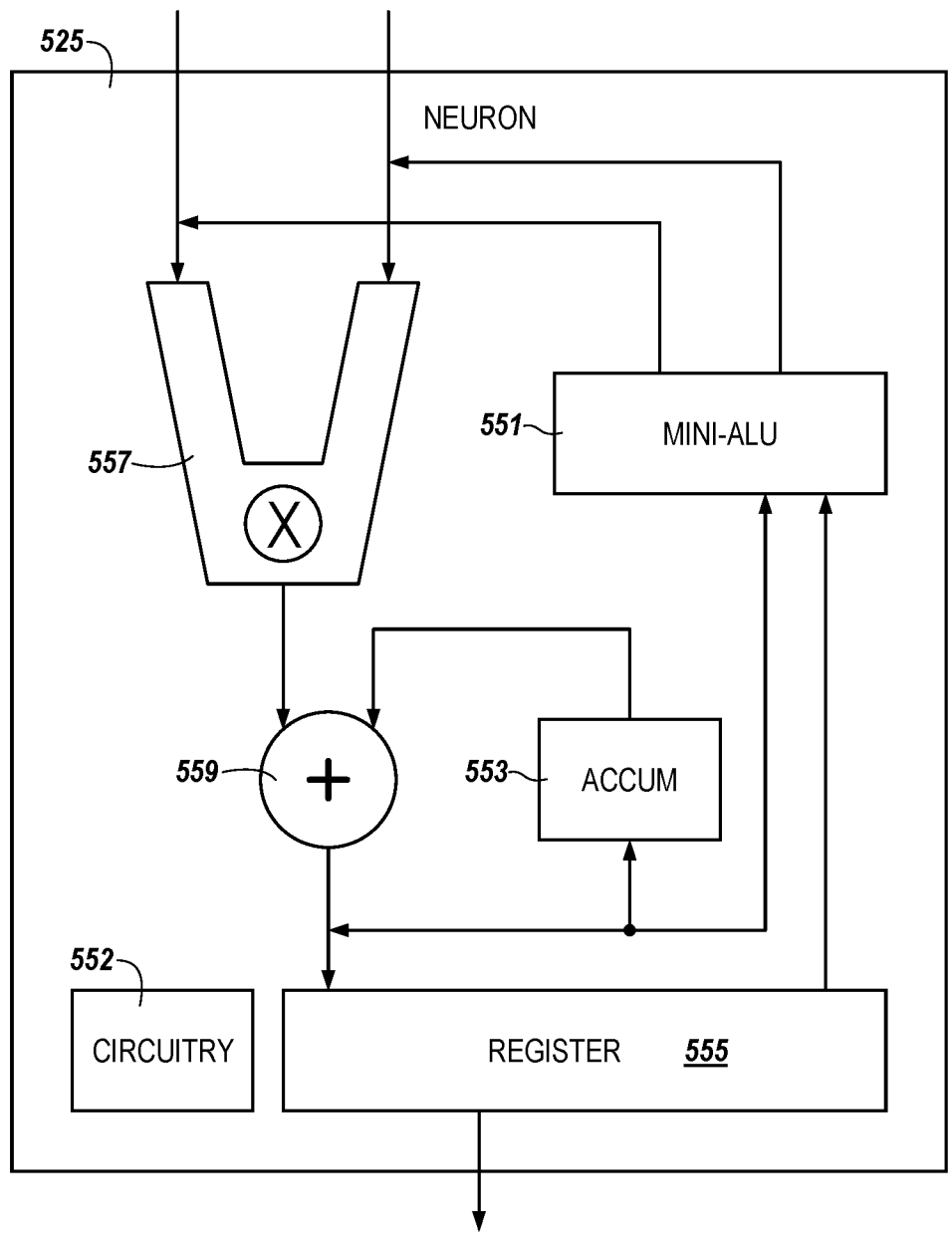
FIG. 5B is a functional block diagram in the form of a neuron including a multiplier, an accumulator, an internal ALU, and a register in accordance with a number of embodiments of the present disclosure.

FIG. 5B is a functional block diagram in the form of a neuron component 525 including a multiplier 557, an accumulator 559, an internal ALU 551, and a register 555 in accordance with a number of embodiments of the present disclosure. The neuron component 525 can include neuron circuitry 552 configured to operate the multiplier 557, the accumulator 559, an internal ALU 551, and a register 555 in order to perform neuromorphic operations. The neuron circuitry 552 can include hardware, logic, or one or more processing devices used to perform the neuromorphic operations. As an example, the neuron component 525 can receive data from a multiplexer (e.g., MUX 545 in FIG. 5A) and the neuron circuitry 552 of the neuron component 525 can cause sending of the data as input into a multiplier 557. The neuron circuitry 552 can cause the multiplier 557 to perform a multiplication operation on the data values received and send as output a result of the multiplication operation to an adder 559. The adder 559 can be coupled to a bit string register 555. The bit string register 555 can store a data value that indicates an overflow of a result of a neuromorphic operation using posits. An internal ALU (e.g., "Mini-ALU") 551 can provide input into the data that the multiplier 557 receives. Further, an accumulator ("ACCUM") 553 can accumulate an output of the adder 559 and provide it as input to the adder 559.

In this way, the neuron component 525 can use neuron circuitry 552 to operate the multiplier 557, the adder 559, the accumulator 553, and the internal ALU 551 to perform neuromorphic operations on data and store the result in the bit string register 555. An output of the bit string register 555 can be sent to an ALU (such as ALU 526 in FIG. 5A) for further operations to be performed on the data (such as a RELU operation, a sigma operation, etc.).

Figure 5C:
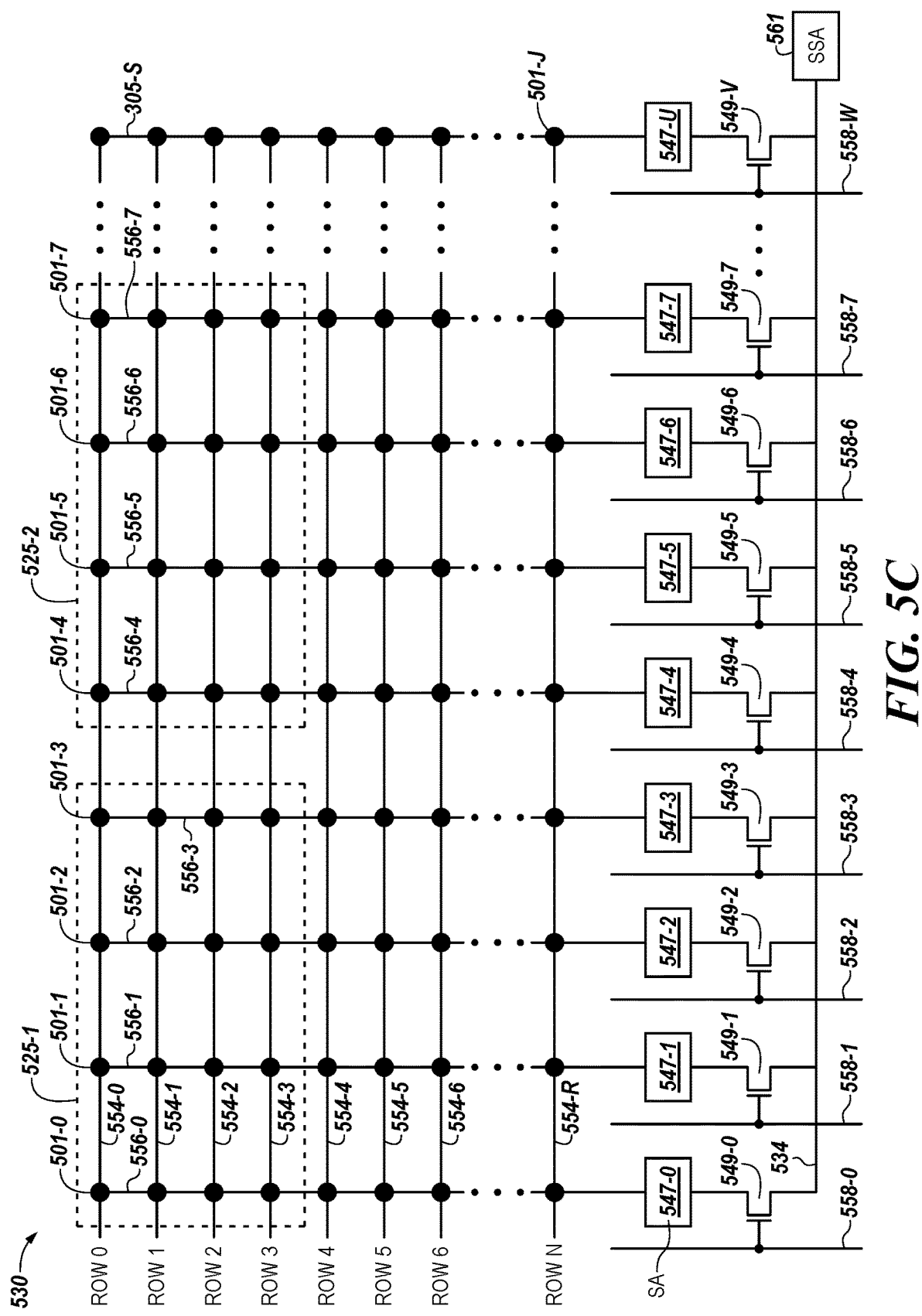
FIG. 5C is a functional block diagram in the form of a memory array of neurons and sense amps in accordance with a number of embodiments of the present disclosure.

FIG. 5C is a functional block diagram of a portion of a memory array 530 in accordance with a number of embodiments of the present disclosure. The array 530 includes a plurality of memory cells 501-0, to 501-J (referred to generally as cells 501) coupled to rows of access lines 554-0, 554-1, 554-2, 554-3, 554-4, 554-5, 554-6, . . . , 554-R (referred to generally as access lines 554) and columns of sense lines 505-0, 505-1, 505-2, 505-3, 505-4, 505-5, 505-6, 505-7, . . . 505-S (referred to generally as sense lines 556). Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

The memory array 530 can include a plurality of neurons 525-1, 525-2 that are made up of a plurality of memory cells 501. For example, as illustrated in FIG. 5C, sixteen memory cells can make up a neuron. However, examples are not so limited. Any number of memory cells can make up the neuron. Each of the memory cells 501 can make up the components of the neuron, as illustrated in FIG. 5B.

Each column of memory cells can be coupled to sensing circuitry (e.g., sense amps 547). In this example, the sensing circuitry comprises a number of sense amplifiers 547-0, 547-1, 547-2, 547-3, 547-4, 547-5, 547-6, 547-7, . . . , 547-U (referred to generally as sense amplifiers 547) coupled to the respective sense lines 556-0, 556-1, 556-2, 556-3, 556-4, 556-5, 556-6, 556-7, . . . , 556-S. The sense amplifiers 547 are coupled to input/output (I/O) line 334 (e.g., a local I/O line) via access devices (e.g., transistors) 549-0, 549-1, 549-2, 549-3, 549-4, 549-5, 549-6, 549-7, . . . , 549-V. In this example, the sensing circuitry also comprises a number of compute components 331-0, 331-1, 331-2, 331-3, 331-4, 331-5, 331-6, 331-7, . . . 331-X corresponding to respective sense amplifiers 547 and coupled to the respective sense lines 556. Column decode lines 558-1 to 558-W are coupled to the gates of transistors 549-1 to 549-V, respectively, and can be selectively activated to transfer data sensed by respective sense amplifiers 547-0 to 547-U and/or stored in respective compute components 331-0 to 331-X to a secondary sense amplifier 561. In a number of embodiments, the compute components 331 can be formed on pitch with the memory cells of their corresponding columns and/or with the corresponding sense amplifiers 547.

In a number of embodiments, the sensing circuitry (e.g., compute components 331 and sense amplifiers 547) is configured to perform a signed division operation on elements stored in array 330. As an example, a plurality of elements each comprising four data units (e.g., 4-bit elements) can be stored in a plurality of memory cells. A first 4-bit element of the plurality of elements can be stored in a first group of memory cells coupled to a first sense line (e.g., 556-0) and to a number of access lines (e.g., 554-0, 554-1, 554-2, 554-3), and a second element can be stored in a second group of memory cells coupled to a second sense line (e.g., 556-1) and to the number of access lines (e.g., sense lines 554-0, 554-1, 554-2, 554-3). As such, the first element and the second element are stored in a first column and a second column, respectively, of memory cells.

Figure 6:
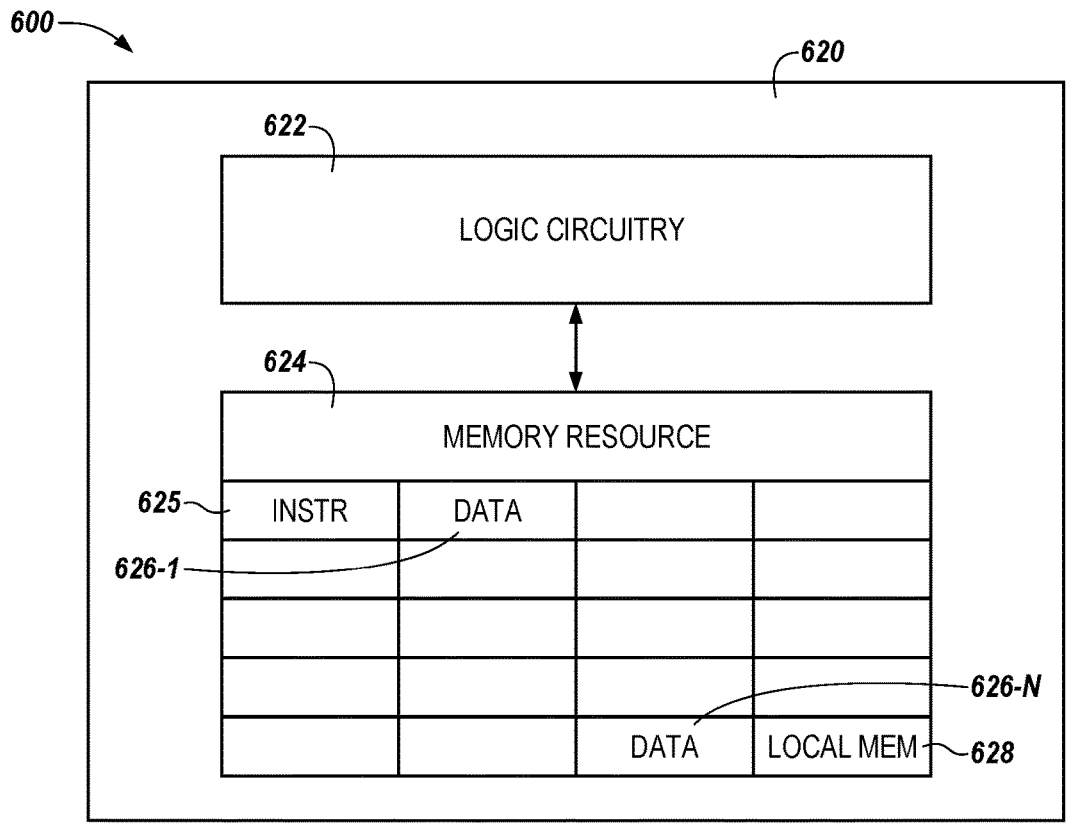
FIG. 6 is a functional block diagram in the form of control circuitry in accordance with a number of embodiments of the present disclosure.

FIG. 6 is a functional block diagram in the form of an apparatus 600 including control circuitry 620 in accordance with a number of embodiments of the present disclosure. The control circuitry 620 can include logic circuitry 622 and a memory resource 624, which can be analogous to the processing resource 122 and the memory resource 124 illustrated in FIG. 1, herein. The logic circuitry 622 and/or the memory resource 624 can separately be considered an "apparatus."

The control circuitry 620 can be configured to receive a bit string in the posit format from a host (e.g., the host 102/202 illustrated in FIGS. 1, 2A, and 2B, herein). In some embodiments, the posit bit string can be stored in the memory resource 624. Once the bit string has been received by the control circuitry 620, arithmetic and/or logical operations can be performed on the posit bit string in the absence of intervening commands from the host and/or the controller. For example, the control circuitry 620 can include sufficient processing resources and/or instructions to perform arithmetic and/or logical operations on the bit strings stored in the memory resource 624 without receiving additional commands from circuitry external to the control circuitry 620.

The logic circuitry 622 can be an arithmetic logic unit (ALU), a state machine, sequencer, controller, an instruction set architecture (ISA), or other type of control circuitry. As described above, an ALU can include circuitry to perform operations (e.g., arithmetic operations, logical operations, bitwise operations, etc.) such as the operations described above, on integer binary numbers, such as bit strings in the posit format. An instruction set architecture (ISA) can include a reduced instruction set computing (RISC) device. In embodiments in which the logic circuitry 622 includes a RISC device, the RISC device can include a processing resource that can employ an instruction set architecture (ISA) such as a RISC-V ISA, however, embodiments are not limited to RISC-V ISAs and other processing devices and/or ISAs can be used.

In some embodiments, the logic circuitry 622 can be configured to execute instructions (e.g., instructions stored in the INSTR 625 portion of the memory resource 624) to perform the operations above. For example, the logic circuitry 624 is provisioned with sufficient processing resources to cause performance of arithmetic and/or logical operations on the data (e.g., on bit strings) received by the control circuitry 620.

Once the arithmetic and/or logical operation(s) are performed by the logic circuitry 622, the resultant bit strings can be stored in the memory resource 624 and/or a memory array (e.g., the neuromorphic memory array 230 illustrated in FIG. 2A, herein). The stored resultant bit strings can be addressed such that they are accessible for performance of the operations. For example, the bit strings can be stored in the memory resource 624 and/or the memory array at particular physical addresses (which may have corresponding logical addresses corresponding thereto) such that the bit strings can be accessed in performing the operations.

The memory resource 624 can, in some embodiments, be a memory resource such as random-access memory (e.g., RAM, SRAM, etc.). Embodiments are not so limited, however, and the memory resource 624 can include various registers, caches, buffers, and/or memory arrays (e.g., 1T1C, 2T2C, 3T, etc. DRAM arrays). The memory resource 624 can be configured to receive a bit string (e.g., a bit string in the posit format) from, for example, a host such as the host 102/202 illustrated in FIGS. 1, 2A, and/or a memory array such as the neuromorphic memory array 230 illustrated in FIGS. 2A, herein. In some embodiments, the memory resource 638 can have a size of approximately 256 kilobytes (KB), however, embodiments are not limited to this particular size, and the memory resource 624 can have a size greater than, or less than, 256 KB.

The memory resource 624 can be partitioned into one or more addressable memory regions. As shown in FIG. 6, the memory resource 624 can be partitioned into addressable memory regions so that various types of data can be stored therein. For example, one or more memory regions can store instructions ("INSTR") 625 used by the memory resource 624, one or more memory regions can store data 626-1, . . . , 626-N (e.g., data such as a bit string retrieved from the host and/or the memory array), and/or one or more memory regions can serve as a local memory ("LOCAL MEM.") 628 portion of the memory resource 638. Although 20 distinct memory regions are shown in FIG. 6, it will be appreciated that the memory resource 624 can be partitioned into any number of distinct memory regions.

As discussed above, the bit string(s) can be retrieved from the host and/or memory array in response to messages and/or commands generated by the host, a controller (e.g., the controller 210 illustrated in FIG. 2A, herein), or the logic circuitry 622. In some embodiments, the commands and/or messages can be processed by the logic circuitry 622. Once the bit string(s) are received by the control circuitry 620 and stored in the memory resource 624, they can be processed by the logic circuitry 622. Processing the bit string(s) by the logic circuitry 622 can include performing arithmetic operations and/or logical operations on the received bit string(s).

In a non-limiting neural network training application, the control circuitry 620 can receive an analog bit string that has been converted from an 8-bit posit with es=0. In contrast to some approaches that utilize an 8-bit posit bit string with es=0, an analog bit string can provide neural network training results faster than the 8-bit posit bit string.

Figure 7:
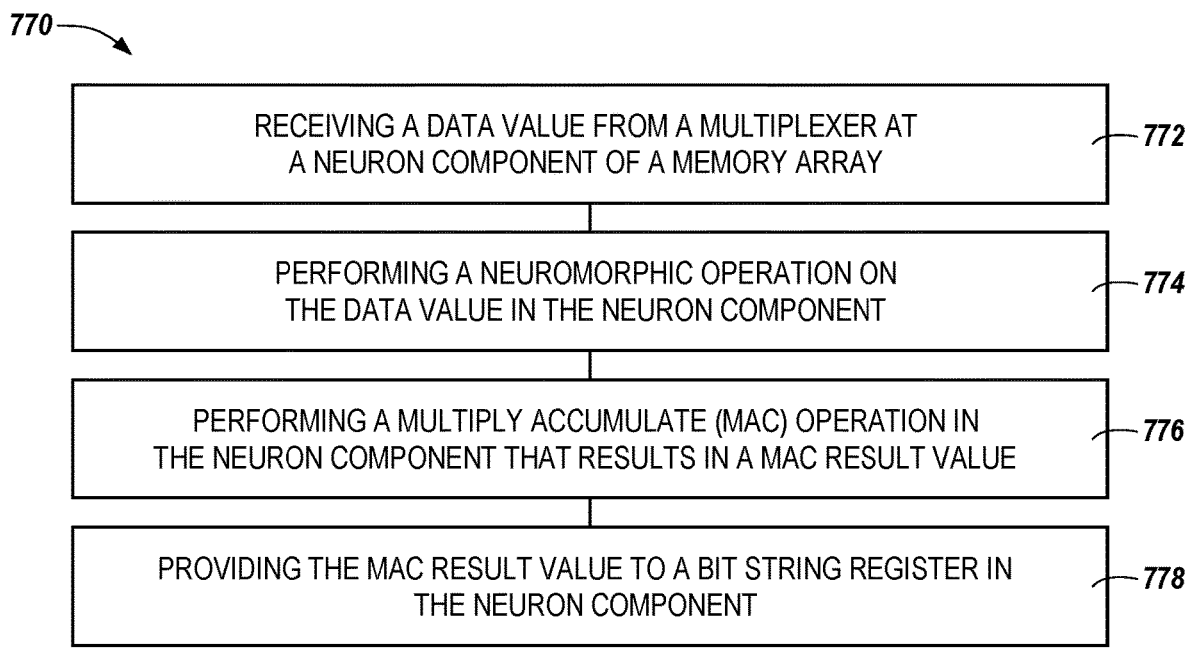
FIG. 7 is a flow diagram representing an example method for performing neuromorphic operations using neurons in accordance with a number of embodiments of the present disclosure.

FIG. 7 is a flow diagram representing an example method 770 for neuromorphic operations on posits in accordance with a number of embodiments of the present disclosure. At block 772, the method 770 can include receiving a data value from a multiplexer at a neuron component of a memory array. The data value can include a bit string in a format that supports arithmetic operations to a particular level of precision. The format can be the posit format. Further, the format can include a mantissa, a regime, a sign, and an exponent. The memory array can be analogous to the memory array 130 illustrated in FIGS. 1 and 230 illustrated in FIG. 2A.

At block 774, the method 770 can include performing a neuromorphic operation on the data value in the neuron component. The neuron component can be analogous to neuron component 125 in FIG. 1, 225 in FIG. 2A, and 525 in FIGS. 5A-5C.

At block 776, the method 770, can include performing a multiply accumulate (MAC) operation in the neuron component that results in a MAC result value. In some embodiments, performance of the operation can include performing a neuromorphic operation on the data written to the memory cell. In some example, performance of the operation on the data occurs in a shorter amount of time or in a fewer number of sub-operations than if the operation is performed on the same data represented in the first format. In some embodiments, the method 770 can further include performing a second MAC operation on the MAC result value, resulting in an additional MAC result value.

At block 778, the method 770 can include providing the MAC result value to a bit string register in the neuron component. performing an operation using the data written to the memory cell resulting in additional data in the second format. The method 770 can further include sending the MAC result value to a device external to the memory device. The device external to the memory device can be a host.

In some embodiments, the method 770 can further include performing an additional neuromorphic operation on an additional data value in an additional neuron component that results in an additional MAC result value, wherein the additional data value is related to the data value. The method can further include providing the additional MAC result value to an additional bit string register in the additional neuron component and combining the MAC result value and the additional MAC result value. In some embodiments, combining the MAC result value and the additional MAC result value can increase a precision of a result of the neuron component and the additional neuron component.

In some embodiments, the method 770 can further include performing a plurality of MAC operations each within a plurality of respective neuron components. A quantity of the plurality of respective neuron components can correspond to a degree of precision of data values stored across a plurality of respective bit string registers within each of the plurality of respective neuron components. The data values stored across the plurality of respective bit string registers can be combined to result in a larger value that results in the degree of precision. In some embodiments, the method 770 can further include performing at least a portion of the MAC operation in an internal ALU within the neuron component.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a plurality of periphery sense amplifiers (PSAs);
a plurality of neuron components coupled to the plurality of PSAs through a plurality of multiplexers, the plurality of neuron component each comprising neuron circuitry; and
a plurality of arithmetic logic units (ALUs) coupled to each of the respective plurality of neuron components;
wherein each of the respective neuron circuitry of the plurality of neuron components further comprises:
a multiplier that receives a data value from the PSAs via the plurality of multiplexers, wherein the data value comprises at least one posit bit string;
an adder that receives an output of a multiplication operation from the multiplier, wherein the multiplier and the adder perform a neuromorphic operation on the data value;
a bit string register that stores a data value that indicates an overflow of a result of the neuromorphic operation using the at least one posit bit string;
a mini-ALU that provides an input to the data value that is received by the multiplier; and
a circuitry configured to operate the multiplier, accumulator, bit string register, and the mini-ALU to perform the neuromorphic operation,
wherein an output of the bit string register is transmitted to the plurality of ALUs that are configured to perform an activation function on the output result of the neuromorphic operation.

2. The system of claim 1, wherein the input that is provided by the mini-ALU is related to the data value that is received from the PSAs via the plurality of multiplexers.

3. The system of claim 2, wherein data values across a plurality of bit string registers in each neuron circuitry is combined to result in a larger value that results in a degree of precision.

4. The system of claim 3, wherein the mini-ALU is configured to perform an additional neuromorphic operation.

5. The system of claim 4, wherein the overflow of the result is transmitted to the mini-ALU in response to a threshold number of neuromorphic operations being performed.

6. The system of claim 1, wherein the activation function includes a rectified linear unit function (ReLU), sigmoid functions, binary step functions, or parametric ReLU functions.

7. The system of claim 1, wherein the plurality of ALUs are external to the plurality of neuron components.

8. The system of claim 6, wherein the neuron circuitry is configured to cause sending of output to the external plurality of ALUs in response to a threshold number of neuromorphic operations being performed.

9. The system of claim 8, wherein the threshold number of neuromorphic operations is a hundred.

\* \* \* \* \*